US006663793B2

(12) United States Patent
Parkhill et al.

(10) Patent No.: US 6,663,793 B2
(45) Date of Patent: Dec. 16, 2003

(54) SOL-GEL-BASED COMPOSITE MATERIALS FOR DIRECT-WRITE ELECTRONICS APPLICATIONS

(75) Inventors: Robert L. Parkhill, Stillwater, OK (US); Steven M. Coleman, Stillwater, OK (US); Edward T. Knobbe, Stillwater, OK (US)

(73) Assignee: Sciperio, Inc., Stillwater, OK (US)

( * ) Notice: Subject to any disclaimer, the term of this patent is extended or adjusted under 35 U.S.C. 154(b) by 130 days.

(21) Appl. No.: 09/777,965

(22) Filed: Feb. 7, 2001

(65) Prior Publication Data
US 2001/0046933 A1 Nov. 29, 2001

Related U.S. Application Data
(60) Provisional application No. 60/180,686, filed on Feb. 7, 2000.

(51) Int. Cl.$^7$ .................. C01G 55/00; C01G 23/00; H01G 4/00; B05D 5/12
(52) U.S. Cl. .................. 252/62.2; 252/500; 252/518.1; 252/519.12; 106/1.15; 106/38.3; 427/79; 427/80; 427/103; 423/22; 423/29
(58) Field of Search .................. 252/62.2, 62.3 R, 252/62.3 BT, 500, 518.1, 519.12, 520.2; 106/1.05, 1.15, 38.3, 600, 733; 427/79, 80, 103, 110, 126.3, 126.5; 423/22, 69, 593, 598, 608; 501/12, 85, 135, 136, 137

(56) References Cited

U.S. PATENT DOCUMENTS

| 4,755,369 | A | * | 7/1988 | Yoshiharu | 423/339 |
|---|---|---|---|---|---|
| 4,977,547 | A | | 12/1990 | Giniewicz et al. | |
| 5,399,535 | A | * | 3/1995 | Whitman | 501/80 |
| 5,958,597 | A | | 9/1999 | Yamana | |
| 6,132,649 | A | | 10/2000 | Cauda et al. | |
| 6,191,523 | B1 | | 2/2001 | Kahn et al. | |

FOREIGN PATENT DOCUMENTS

| JP | 09115438 | * | 5/1997 | H01J/9/20 |

OTHER PUBLICATIONS

Chen et al, "Lithium tantalate/lead zirconate titanate composite ultrasonic transducers", Applied Physics letters, 1999, 74(17), 2552–2554.*
Yi et al, "Preparation of Pb(Zr,Ti)O3 thin films by sol gel processing: Electrical, optical and electro-optic properties", J. Appl. Phys. 1988, 64(5), 2717–2724.*
Arkles, "Commercial Applications of Sol–Gel–Derived Hybrid Materials," MRS Bulletin 402–407 (2001).
Barrow et al., "Thick Ceramic Coatings Using a Sol–Gel Based Ceramic–Ceramic 0–3 Composite," Surface & Coatings Technology 76(1–3):113–118 (1995).
Barrow et al., "In–Line Phase Modulators Using Coaxial Thick Lead Zirconate Titanate Coated Optical Fibers," J. Appl. Phys. 79(6):3323–3329 (1996).
Barrow et al., "Characterization of Thick Lead Zirconate Titanate Films Fabricated Using a New Sol–Gel Based Process," J. Appl. Phys. 81(2):876–881 (1997).
Chen et al., "Lithium Tantalate/Lead Zirconate Titanate Composite Ultrasonic Transducers," Appl. Phys. Letters, 74(17):2552–2554 (1999).
Cheung et al., "Characterization of Barium Titanate Ceramic/Ceramic Nanocomposite Films Prepared by a Sol–Gel Process," Nanostructured Materials 11(7):837–844 (1999).
McIntyre et al., "Electrical Characterization of PZT on Rapid Thermally Annealed Ruthenium Oxide Electrodes," Integrated Ferroelectrics 10(1–4):301–308 (1995).
Publication on Kia corporation website entitled Kia Sealants url: www.kemcointernational.com No date.
Publication on Viox corporation website entitled Producers of Electronic Glass Frit and Powers url: www.viox.com No date.
Publication on Kia corporation website entitled Frit Glass, Powders and Sealants url: www.kemcointernational.com No date.
Publication on Kia corporation website entitled Table 2—Applications: Crystallizing Glasses url: www.kemcointernational.com No date.
Publication on Kia corporation website entitled Table 1—Typical Properties Sealable to Materials: Sealing Glass Reference Guide url: www.kemcointernational.com No date.
Publication on Kia corporation website entitled 89 Expansion Systems url: www.kemcointernational.com No date.
Publication on Kia corporation website entitled 46 Expansion Systems url: www.kemcointernational.com No date.
Publication on Kia corporation website entitled 72 Expansion Systems url: www.kemcointernational.com No date.
Publication on Kia corporation website entitled 85 Expansion Systems url: www.kemcointernational.com No date.
Sayer et al., "Functional Ceramic Films and Coatings: Linking Chemistry and Innovation," Canadian Ceramics Quarterly –J. Canada Ceram. Soc. 65(2):124–130 (1996).
Sedlar et al., "Characterization of Doped BST Thin Films Prepared by a Modified Sol–Gel Method," Intergrated Ferroelectrics 10(1–4):113–121 (1995).

(List continued on next page.)

Primary Examiner—Yogendra N. Gupta
Assistant Examiner—Kallambella M Vujayakumar
(74) Attorney, Agent, or Firm—Needle & Rosenberg, P.C.

(57) ABSTRACT

The present invention relates to a method for producing a low temperature 0–3 composite material, comprising the steps of providing a mixture, wherein the mixture comprises a liquid phase and a particulate phase and wherein the liquid phase comprises a reactive metal alkoxide; depositing the mixture on to a plastic substrate; and consolidating the mixture to provide a 0–3 composite material, wherein the 0–3 composite material is suitable for use as an electronic component.

18 Claims, No Drawings

OTHER PUBLICATIONS

Sedlar et al., "Structural and Electrical Properties of Ferroelectric Bismuth Titanate Thin Films Prepared by the Sol–Gel Method," *Ceram. Intl. 22(3):*241–247 (1996).

Sedlar et al., "Sol–Gel Processing and Properties of Cerium Doped Barium Strontium Titanate Thin–Films," *J. Sol–Gel Sci. Tech. 5(3):*201–210 (1995).

Yi et al., "An Actetic Acid–Water–Based Sol–Gel PZT Process I. Modification of Zr and Ti Alkoxides with Acetic Acid," *J. of Sol–Gel Sci. Tech. 6(1):*65–74 (1996).

Yi et al., "An Acetic Acid–Water–Based Sol–Gel PZT Process II. Formation of a Water–Based Solution," *J. of Sol–Gel Sci. Tech. 6(1):*75–82 (1996).

* cited by examiner

SOL-GEL-BASED COMPOSITE MATERIALS FOR DIRECT-WRITE ELECTRONICS APPLICATIONS

This application claims the benefit of U.S. Provisional Application No. 60/180,686, filed Feb. 7, 2000. +gi This invention was made with Government support under Contract DABT 63-99-C-0008 awarded by the Department of Defense. The Government has certain rights in this invention.

BACKGROUND OF THE INVENTION

The sol-gel process, which in the most general sense is based on inorganic polymerization reactions, is considered a unique route for the chemical synthesis of ceramic-containing materials. The process provides a low-temperature route for preparing ceramic materials with excellent homogeneity, a low sintering temperature, low impurity levels, and customizable physical features.

The wide availability of metal alkoxide precursors facilitates preparation of almost any type of ceramic composition, including some phases not achievable through conventional high-temperature processes. By combining various metal alkoxides, unique amorphous networks can be prepared in chemical compositions matching those of almost all metal oxides currently available in powder form. With such a large potential for developing numerous types of ceramic systems, sol-gel science can be utilized in almost any type of ceramics application.

The "0–3 composite" concept focuses upon the development of thick sol-gel-derived ceramic composite films. They are deposited from a solution comprised of both macroscopically liquid (sol) and particulate (aggregate) phases. The liquid portion is derived via a relatively conventional sol-gel route toward the preparation of oxide coatings. This sol phase, which contains the reactive alkoxide precursors, subsequently gels and condenses to form a matrix that entraps the particulate phase (1–2). This process is analogous to the fabrication of a brick wall, wherein the sol-gel-derived matrix acts as mortar and the entrapped oxide particles act as bricks (2).

The designation "0–3" refers to the connectivity of the elements in each phase; that is, the entrapped particulate phase exhibits no interparticle connectivity while the sol phase exhibits three-dimensional connectivity upon gelation. Thus, 0–3 composites result from a hybrid colloid particle-sol-gel suspension.

Compared to typical sol-gel processes, the 0–3 composite method produces films that (1) are orders of magnitude thicker per coating application, (2) can form with very little or no cracking, and (3) dry into more densely packed films (xerogels). These 0–3 composite films also exhibit substantially lower consolidation temperatures and better substrate adhesion than traditional paste-derived layers. For these reasons, 0–3 composites appear to be promising candidates for developing highly densified thick ceramic films at low temperatures.

Needs exist for a direct-write process for writing electronic components onto low-temperature plastic substrates. That need is addressed by the inventive sol-gel-based 0–3 composite process described in the ongoing specification. The present inventors have achieved surprising results by combining the sol-gel process and the 0–3 composite process.

SUMMARY OF THE INVENTION

Sol-gel-derived "0–3 composite" ceramics are being developed under the DARPA MICE (Defense Advanced Research Project Agency, Mesoscopic Integrated Conformal Electronics) program for application to electronics components directly written onto low-temperature substrates.

The 0–3 composite materials are prepared from a mixture of liquid-phase and solid-phase constituents, as are the pastes conventionally used to prepare thick-film materials for the electronics industry. When compared with conventional paste materials and processes, however, the new 0–3 composites exhibit several potential advantages, including substantial reductions in (1) processing temperatures, (2) solvent concentrations, and (3) organic post-processing-residual concentrations.

In addition, the rapid removal of solvent during application is compatible with such rapid prototyping methods as laser densification. Preliminary results of the CMS Technetronics, Inc.—Oklahoma State University (OSU) Mesoscopic Integrated Conformal Electronics (MICE) project clearly indicate that 0–3 composites may be deposited onto plastic substrates while still meeting expected performance standards. Therefore, the direct writing of electronics components onto such low temperature substrates as plastic may be achieved using sol-gel-based 0–3 composites. The inventive process is useful for resistors, capacitors, insulators, inductors and conductors.

These and further and other objects and features of the invention are apparent in the disclosure, which includes the above and ongoing written specification and the claims.

DETAILED DESCRIPTION OF PREFERRED EMBODIMENTS

The developing of low-temperature resistor materials was based on the combination of concepts from both 0–3 composite and aerospace paint technologies. The 0–3 composites, derived from a solution containing both liquid (sol) and particulate phases, yields thick oxide films which may be prepared at low temperatures without developing such structural defects as cracks.

The essential concept in such a system is that the liquid phase, mainly composed of a reactive metal alkoxide, is chemically converted into a metal oxide upon exposure to water. One disadvantage to such precursors is that resistor materials based on ruthenium (chiefly ruthenium(IV) oxide) readily react with alcohols, major byproducts of metal alkoxide hydrolysis. To overcome these reactivity issues, aerospace paint technology was incorporated in the 0–3 composite synthesis to eliminate organic moieties.

Satellite thermal-control coatings (white paints), which generally consist of zirconium(IV) oxide particles suspended in a potassium silicate glass matrix, are conceptually identical to 0–3 composites. The substitution of potassium silicate glass for the metal alkoxide yields a binder phase that becomes more reactive and more able to form a rigid three-dimensional network upon solvent loss.

The unique advantages of using potassium silicate glass in a resistor formulation are (1) low processing temperatures and (2) the ability to use $RuO_2$ particles without risking metal reduction ($RuO_2$ readily undergoes redox reactions with alcohols). Therefore, through this blend of 0–3 composite and aerospace coating technologies, a ruthenium-based resistor may be constructed and processed at extremely low relative temperatures.

The capacitor materials developed for the MICE program by CMS and OSU are based solely on 0–3 composite technology. Pastes of dielectric materials with both low and high dielectric constant ($\kappa$) values were formulated by mixing selected dielectrics into specific metal alkoxide precursors. The cardinal attributes associated with the selection of metal alkoxide precursors were (1) compositional compatibility with the powder used, (2) reactivity with water, (3) physical properties (liquid or solid), and (4) thermal-decomposition properties.

Metal alkoxides with compositional compatibility were used to improve or maintain κ values. The use of chemically identical binder and filler phases yields homogenous compositions capable of producing more stable films with higher κ values. The reactivity of the alkoxide precursors was chosen so that they could be hydrolyzed easily upon exposure to ambient humidity. Increased reactivity provides a way to reduce the residual concentrations of organics, thereby lowering the potential for dielectric losses.

The physical properties of the metal alkoxides were chosen so that the molecular precursors could also act as solvents, thereby reducing or eliminating the need for organic solvents. Finally, precursors with low thermal or photoinitiated decomposition thresholds were preferred because such decompositions provide a means to control powder packing efficiency, lower processing temperatures, and lower the potential for organic contamination. By incorporating all four attributes, CMS and OSU have been able to develop, at low temperatures, capacitor, resistor, inductor and conductor materials with exceptional performance.

The accomplishments of CMS and OSU in their direct-write sol-gel-derived 0–3-composite-materials project include the complete construction of several different microelectronics devices. Resistor, capacitor, conductor and inductor materials have all been prepared using sol-gel-based processes. The resistor and inductor materials were prepared by combining potassium silicate-based precursors with selected composite powders, while the capacitor materials were prepared by combining various silicate, titanate, and barium titanate precursors.

In each system, specific precursors were chosen based on reactivity, physical state, and compatibility with the composite powders. Work is continuing towards improvements in performance and such physical properties as adhesion, morphology, density, and the elimination of structural defects, if any.

While the invention has been described with reference to specific embodiments, modifications and variations of the invention may be constructed without departing from the scope of the invention, which is defined in the following claims.

We claim:

1. A method for producing a low temperature 0–3 composite material, comprising the steps:
   a) providing a mixture, wherein the mixture comprises a liquid phase and a particulate phase and wherein the liquid phase comprises a reactive metal alkoxide;
   b) depositing the mixture on to a plastic substrate; and
   c) consolidating the mixture to provide a 0–3 composite material, wherein the 0–3 composite material is suitable for an electronic component.

2. The method of claim 1, wherein the liquid phase further comprises a solvent.

3. The method of claim 1, wherein step c) further comprises converting the liquid phase to a metal oxide in the presence of water.

4. The method of claim 1, wherein the at least one reactive metal alkoxide is a ruthenium alkoxide.

5. The method of claim 4, wherein the at least one reactive metal alkoxide is a ruthenium (IV) alkoxide.

6. The method of claim 1, wherein the mixture comprises potassium silicate and zirconium (IV) oxide.

7. The method of claim 6, wherein the zirconium(IV) oxide is suspended within the potassium silicate.

8. The method of claim 6, wherein the composite material of step c) is a potassium silicate glass matrix.

9. The method of claim 8, wherein the zirconium (IV) oxide is suspended within the potassium silicate glass matrix.

10. The method of claim 9, wherein the composite material is a structure having a rigid three-dimensional network.

11. The method of claim 10, wherein the structure is a low-temperature resistor.

12. The method of claim 11, wherein the mixture comprises at least one dielectric material.

13. The method of claim 12, wherein the mixture comprises a relatively low dielectric material and a relatively high dielectric material.

14. The method of claim 1, wherein the mixture comprises potassium silicate and at least one composite powder.

15. The method of claim 14, wherein the 0–3 composite material is suitable for a resistor and/or inductor material.

16. The method of claim 1, wherein the mixture comprises one or more of a silicate, titanate and barium titanate.

17. The method of claim 16, wherein the 0–3 composite material is suitable for a capacitor material.

18. The method of claim 1, wherein the composite material is suitable for a resistor, capacitor, conductor or inductor.

* * * * *